United States Patent [19]

Guillet

[11] Patent Number: 4,614,703

[45] Date of Patent: Sep. 30, 1986

[54] NEGATIVE PHOTORESISTS OF α-CHLOROVINYL METHYL KETONE COPOLYMERS

[75] Inventor: James E. Guillet, Don Mills, Canada

[73] Assignee: Allied Corporation, Morris Township, Morris County, N.J.

[21] Appl. No.: 666,863

[22] Filed: Oct. 31, 1984

[51] Int. Cl.[4] ............... G03C 1/71; C08F 8/00
[52] U.S. Cl. .................... 430/271; 430/270; 430/272; 430/311; 522/155; 522/153; 526/293; 526/291; 526/284
[58] Field of Search ............... 430/270, 271, 272, 311; 526/293, 291, 284; 204/159.14; 522/155, 153

[56] References Cited

U.S. PATENT DOCUMENTS

| | | | |
|---|---|---|---|
| 2,173,066 | 9/1939 | Metzger et al. | 526/291 |
| 3,268,333 | 8/1966 | Altman et al. | 96/27 |
| 3,753,952 | 8/1973 | Guillet | 260/63 R |
| 3,811,931 | 5/1974 | Guillet | 117/932 B |
| 3,812,025 | 5/1974 | Guillet | 204/159.14 |
| 3,853,814 | 12/1974 | Guillet | 260/63 R |
| 3,860,538 | 1/1975 | Guillet et al. | 204/159.14 |

FOREIGN PATENT DOCUMENTS

975492 9/1975 Canada .
572878 9/1943 United Kingdom ............... 526/293

OTHER PUBLICATIONS

E. M. Kosower and G.-S. Wu, Halogenation with Copper(II), J. Org. Chem, Mar. 1963; pp. 633-638.

*Primary Examiner*—John E. Kittle
*Assistant Examiner*—Cynthia Hamilton
*Attorney, Agent, or Firm*—Arthur J. Plantamura; Jay P. Friedenson; Patrick L. Henry

[57] ABSTRACT

A novel class of copolymeric negative photoresists is provided whose sensitivity is based upon the presence of α-chloro ketone moieties. The general structure for the monomers from which the copolymers can be formed is:

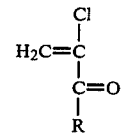

where R is a substituent selected from 1 to 6 carbon alkyl and halogen substitutes alkyl, phenyl, and halogen substituted phenyl and napthyl and the comonomers are comonomers selected from the group consisting of 1-4 carbon alkyl acrylates and methacrylates, styrene vinyl toluene and vinyl acetate and may include additionally other comonomers that are compatible and have the polymerizable $>C=C<$ group. The copolymers form crosslinked networks and provide useful negative photoresists which are sensitive in the ultraviolet wavelength range of between about 200 nm to 300 nm. When used in negative photoresist compositions, these chloro vinyl methyl ketone containing compounds produce a high resolution and thus higher information density in microcircuits manufactured using these photoresists.

10 Claims, No Drawings

NEGATIVE PHOTORESISTS OF α-CHLOROVINYL METHYL KETONE COPOLYMERS

BACKGROUND OF THE INVENTION

1. Field of the Invention

This invention relates to novel negative photoresist compositions and to the production of negative photoresist films. In particular, the invention deals with a novel class of copolymers of α-chlorovinyl methyl ketone. When cast in thin films and exposed to radiation (such as ultraviolet light), these copolymers form a crosslinked network making the materials useful as negative photoresists.

2. Description of the Prior Art

Photoresists are materials which change their solubility in response to a developer solution after the photoresist has been exposed, such as to ultraviolet radiation. Photoresist compositions may comprise a photo-sensitive compound (hereafter sometimes called sensitizer of photosensitizer), which is blended with a film forming polymeric resin and a solvent. Photoresist compositions may comprise also polymeric materials which of themselves are inherently light sensitive. It is with the latter type, specifically a copolymeric material, that the present invention is concerned. As a consequence of the exposure to radiation of the photoresist, a different solubility rate results between the exposed and unexposed (masked over) portions of a resist film that yields a surface relief pattern after the development. Those photoresists which become more soluble in the exposed regions are referred to as positive photoresists.

The photoresists are applied in any suitable manner, such as by spin coating from an organic solvent or solvent mixture, onto a substrate, such as silicon wafers and chrome plated glass plates. A developer removes the areas of the coated photoresist film that has been exposed to light or other form or irradiation so as to produce a pattern in the photoresist film that has been exposed to light or other form of irradiation so as to produce a pattern in the photoresist film.

The application of the photosensitive film to various substrates is an essential step in the fabrication of integrated circuits. The substrates are generally silicon wafers which may have a thin oxide coating or other coating such as a silicon nitride or aluminum. The photosensitive film is used to pattern the substrate in a series of steps including exposure, development and substrate etch. It is essential that the mask pattern be accurately reproduced in the substrate etch pattern. To achieve this high degree of accuracy, it is essential that the photoresist film be of uniform thickness, have good adhesion to substrates, good contrast in images formed, and good etch resistance properties.

One of the limitations of materials currently used as commercial photoresists is their lack of sensitivity to light at wavelengths much below 300 nm. The resolution attainable with these resists is typically in the $2\mu$–$4\mu$ range and would be improved were they sensitive to shorter wavelengths of light. There is, therefore, a need for photoresist materials that are sensitive in the deep ultraviolet (UV) light range (200 nm–300 nm), in that a higher resolution and thus a such materials permit a higher resolution and thus a higher information density in the microcircuits manufactured using them. This sensitivity in the deep UV light range should of course be accompanied by the other normal attributes of a resist material including good adhesion to substrates, good contrast in images formed, good etch resistance properties, and the like.

SUMMARY OF THE INVENTION

In accordance with the invention, we have discovered a new class of copolymeric negative photoresists which are inherently photosensitive and whose sensitivity derives from an α-chlorovinyl methyl ketone or its analogues. The comonomers which are combined with at least one of the α-chlorovinyl methyl ketones, to yield the novel copolymeric compositions of the invention, are styrene and methyl methacrylate, and mixtures thereof.

It has been found that copolymers of α-chloro vinyl methyl ketone with comonomers selected from the group consisting of 1-4 carbon alkyl acrylates and methacrylates, styrene vinyl toluene and vinyl acetate are conducive to the preparation of uniform, thin film formations which are sensitive to light in the desirable wavelength region and which do not other wise impact adversely on the use of the copolymer for photoresist usage. In addition to the above comonomers, other compounds having the polymerizable $>C=C<$ group may be added to and copolymerized with these comonomeric mixtures.

DESCRIPTION OF THE PREFERRED EMBODIMENT

The novel photoresist compositions of the invention are characterized by the property of becoming suitably cross-linked when exposed to the desired ultraviolet light range, making them advantageous as negative photoresists. The solvent employed with these copolymers in preparing the photoresist composition may comprise any of various known compounds that are known to be suitable, i.e., are compatible, for providing a smooth, uniform thin film. Typical solvents which may be employed include 2-ethoxy; ethyl acetate, cyclohexane, methyl isobutyl ketone, chlorobenzene, toluene and the like.

The sensitivity of the polymeric negative photoresists resists of the invention is based upon the presence in the copolymer composition of α-chloro ketone moieties. The general structure for the α-chlorovinyl ketone monomers (a) from which the copolymers useful in the present invention may be derived is:

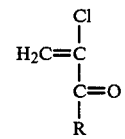

where R is a substituent selected from the group consisting of 1 to 6 carbon alkyl and halogen substituted alkyl phenyl and halogen substituted phenyl and naphthyl. It is essential that the copolymers contain also at least one of the comonomers (b) that are copolymerized with the compounds of the above formula (a). Such comonomers (b) include: comonomers selected from the group consisting of 1-4 carbon alkyl acrylates and methacrylates, styrene vinyl toluene and vinyl acetate Illustrative of compounds which may be added additionally to the copolymers of (a) and (b) of the present invention are any of various $>C=C<$ group containing monomers that are substantially compatible with at least one of the monomers of the above copolymerizable combinations of monomers (a) and (b). Examples of such polymerizable compounds are acrylonitrile, acrylamide, methyl styrene, acrylic acid, methacrylic acid, chlorostyrene, isoprene, and the like.

The UV absorbence of these polymers has been found to be attributable to the ketone group and falls in the 200 nm-300 nm region, thereby fulfilling the need for deep UV sensitivity in this desirable light range.

Generally amounts of from about 0.5 to about 80 percent by weight and preferably 2 to 50 percent by weight of the α-chlorovinyl ketone monomer is incoporated to provide the photosensitive polymer. The balance of the monomers is provided by comonomer (b) with or without, additionally, a compatible monomer having a polymerizable $>C=C<$ group.

The invention will be further described by reference to the following specific examples. It should be understood, however, that although these examples may describe in detail certain preferred components and/or conditions of the invention, they are given primarily for purposes of illustration and the invention in its broader aspects is not limited thereto.

EXAMPLES I-IV

α-chlorovinyl methyl ketone was synthesized using the procedures of U.S. Pat. No. 2,173,066.

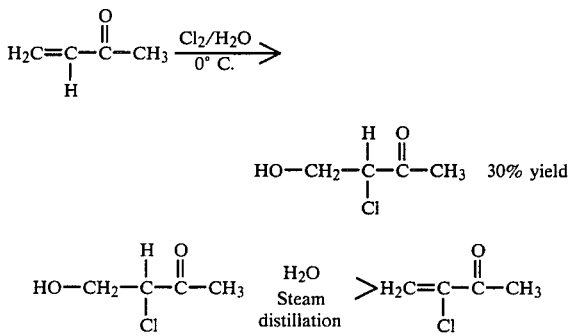

The ketone is obtained in low yield and is unstable, turning black upon standing. The material obtained was used in a homopolymerization and in bulk copolymerization with methyl methacrylate, styrene and methacrylonitrile. Bis (4-t-butyl-cyclohexyl) peroxydicarbonate was used as the catalyst and the reactions were run at 50° C. Results are shown in Table I.

TABLE I

Summary of Reactions

| Example | M$_2$ | M$_2$ | Type | Initiator | Temp. °C. | Time hr. | Yield % |
|---|---|---|---|---|---|---|---|
| I | ClVMK (16) | MMA (84) | Bulk | PODC$^a$ | 50 | 36 | 30 |
| II | ClVMK (16) | STY (84) | Bulk | PODC | 50 | 36 | 30 |
| III | ClVMK (16) | MAcN (84) | Bulk | PODC | 50 | 36 | Trace |
| IV | ClVMK | — | Bulk | PODC | 50 | 36 | Trace |

The bulk copolymerizations with styrene and methyl methacrylate were each worked up as follows. The viscous reaction mixture was dissolved in a 4:1 toluene acetone mix; this solution was then added dropwise to a large volume of hexane. The precipitated polymer was collected and vacuum dried; satisfactory yields of white/off-white polymeric products were produced. The methacrylate and styrene copolymers were tested for sensitivity to ultra violet light in the solid state. (Results are provided in Table II).

TABLE II

| Ketone | Copolymer | $[\eta]_o$ dl/gm | $M_o$ | $[\eta]_t$ after 1500 mJ exposure |
|---|---|---|---|---|
| CLVMK* | MMA | 0.63 | $1.4 \times 10^5$ | crosslinks |
| CLVMK | STY | 0.46 | $8.9 \times 10^4$ | crosslinks | where CLVMK = chlorovinyl methyl ketone; MMA = methylmethacrylate; and STY = styrene.

In solution, these copolymers show good degradability (decrease in molecular weight) as evidence by a decrease in intrinsic viscosity following exposure to UV light. The solid state measurement, show similar good sensitivity, but with chain cross linking as the end result.

These tests were performed as follow: A 3μ film of the α-chlorovinyl methyl ketone/methyl methacrylate copolymer, cast on a glass plate and dried for 1 hour at 75° C., was completely soluble in methylene chloride; a comparably prepared film that was exposed to 1500 mJ of UV radiaton (Optical Associates, Inc. mercury-xenon lamp, no filter) was almost completely insoluble. A similar result was obtained for the α-chlorovinyl methyl ketone/styrene copolymer although the exposed material showed a less marked insolubility. Based on the foregoing, these materials demonstrate usefulness as negative photoresists that are functional in the deep UV range.

Polymr Sensitivity Testing

The following procedure was employed to test polymer sensitivity.

(i) A solution of ca. 50 mg of polymer is prepared in a 10 ml volumetric flask using a relatively high boiling solvent (e.g., toluene).

(ii) Two 5 ml aliquots are pipetted onto 4" diameter glass discs sitting on a carefully leveled surface. The solvent is allowed to evaporate, leaving a film of nominal thickness ca. 3μ.

(iii) One of the discs is exposed to the desired level of UV light, the other is kept as a control blank.

(iv) Each disc is "developed" by placing it in a well in a custom-machined developing tank and then covering the film with ca. 2 ml of developing solvent (ideally a good solvent for the polymer). The tank is covered to prevent solvent loss by evaporation and left for 15–20 min. The resulting solution is then carefully transferred to a 10 ml volumetric flask. The disc is covered with a second portion of about 2 ml of solvent and the process is repeated. After a third wash with solvent, the combined washes are made up to the 10 ml level. If the material has cross linked, it is observable at this stage as the film remains undissolved. Steps V and VI, below, are not performed in this case, i.e. where the film is undissolved.

(v) The intrinsic viscosity of the solutions (produced in iv) of both exposed and unexposed polymer are then measured.

(vi) The ratio of $[\eta]unexposed/[\eta]exposed$ is then related to the number of chain scissions per molecule, using the Mark-Houwink relationship $[\eta]=KM^a$, to determine the revelant molecular weights.

Unexposed films were rapidly dissolved by toluene; the exposed films had insoluble material present after over 72 hours contact with toluene. Each of the copolymers degrade upon exposure in solution.

The invention contemplates, in addition to the novel photoresist compositions, an intermediate article of manufacture comprising a microcircuit element substrate having applied thereon the said polymeric photoresist composition.

It will be apparent that various modifications may be made by one skilled in the art within the scope of, and without departing from the spirit of, the present invention.

What is claimed is:

1. An article of manufacture comprising a microcircuit element substrate having applied thereon a thin homogeneous film sensitive in the deep UV light range of a negative photoresist composition comprising a copolymer in which at least one of the comonomers is selected from the group consisting of (a) a monomer of the formula:

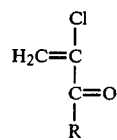

where R is a substituent selected from 1 to 6 carbon alkyl and halogen substituted alkyl, phenyl and halogen substituted phenyl, and naphthyl, and (b) at least one of the comonomers is selected from the group consisting of 1–4 carbon alkyl acrylates and methacrylates, styrene vinyl toluene and vinyl acetate.

2. The article of claim 1 wherein a third comonomer having the polymerizable $>C=C<$ group is copolymerized with the comonomers (a) and (b).

3. The article of claim 1 wherein the comonomer (a) is α-chlorovinyl methyl ketone.

4. The article of claim 1 wherein the monomer (b) is methyl methacrylate.

5. The article of claim 1 wherein the monomer (b) is styrene.

6. The article of claim 2 wherein the monomer (a) is α-chlorovinyl methyl ketone.

7. The article of claim 2 wherein the monomer (b) is methyl methacrylate.

8. The article of claim 2 wherein the monomer (b) is styrene.

9. The article of claim 3 wherein the monomer (b) is methyl methacrylate.

10. The article of claim 3 wherein the monomer (b) is styrene.

* * * * *